(12) United States Patent
Endo et al.

(10) Patent No.: US 7,022,466 B2
(45) Date of Patent: *Apr. 4, 2006

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 235 days.

This patent is subject to a terminal disclaimer.

(21) Appl. No.: 10/351,308

(22) Filed: Jan. 27, 2003

(65) Prior Publication Data

US 2003/0143494 A1 Jul. 31, 2003

(30) Foreign Application Priority Data

Jan. 28, 2002 (JP) .................................. 2002-018101

(51) Int. Cl.
*G03F 7/20* (2006.01)

(52) U.S. Cl. ....................... 430/322; 430/330

(58) Field of Classification Search ................. 430/322, 430/311, 325, 330
See application file for complete search history.

(56) References Cited

U.S. PATENT DOCUMENTS 6,716,730 B1 * 4/2004 Endo et al. .................. 438/552

FOREIGN PATENT DOCUMENTS

| JP | 5-136026 A | 6/1993 |
| JP | 2001-244196 A | 9/2001 |

* cited by examiner

*Primary Examiner*—Kathleen Duda
(74) *Attorney, Agent, or Firm*—McDermott Will & Emery LLP

(57) ABSTRACT

Pattern exposure is performed by selectively irradiating a resist film with extreme UV of a wavelength of a 1 nm through 30 nm band at exposure energy of 5 mJ/cm$^2$ or less. After the pattern exposure, the resist film is developed so as to form a resist pattern.

12 Claims, 5 Drawing Sheets

PATTERN FORMATION METHOD

BACKGROUND OF THE INVENTION

The present invention relates to a pattern formation method employed in semiconductor fabrication process.

In accordance with the increased degree of integration of semiconductor integrated circuits and the downsizing of semiconductor devices, development of lithography technique is desired to be accelerated.

At present, patterns are formed through photolithography using a mercury lamp, KrF excimer laser or ArF excimer laser as exposing light. In order to form a fine pattern of 0.1 μm or less and particularly 50 nm or less, extreme UV of a wavelength (of a 1 nm through 30 nm band) shorter than that of the aforementioned exposing light is desired to be used as the exposing light. This is because a highly productive pattern formation method using exposing light is desired to be prolonged in its life.

Also, in using extreme UV as the exposing light, a chemically amplified resist material with high resolution and sensitivity is preferably used.

Now, a conventional pattern formation method using extreme UV as the exposing light will be described with reference to FIGS. 5A through 5D.

First, a chemically amplified resist material having the following composition is prepared:

| | |
|---|---|
| Base polymer: poly((2-methyl-2-adamantyl acrylate) – (γ-butyrolactone methacrylate)) (wherein 2-methyl-2-adamantyl acrylate:γ-butyrolactone methacrylate = 60 mol %:40 mol % | 2 g |
| Acid generator: triphenylsulfonium triflate | 0.04 g |
| Solvent: propylene glycol monomethyl ether acetate | 20 g |

Next, as shown in FIG. 5A, the chemically amplified resist material is applied on a semiconductor substrate 1, so as to form a resist film 2 with a thickness of 0.2 μm. Thereafter, the resist film 2 is pre-baked.

Then, as shown in FIG. 5B, pattern exposure is performed by irradiating the pre-baked resist film 2 with extreme UV 3 (of a wavelength of a 13.5 nm band) output by a laser plasma light source and having exposure power of 10 W and exposure energy of 20 mJ/cm$^2$ selectively through a reflection mask not shown.

Thereafter, as shown in FIG. 5C, the resist film 2 having been subjected to the pattern exposure is subjected to baking 4 at a temperature of 100° C. for 60 seconds with a hot plate. Thus, an exposed portion 2a of the resist film 2 becomes soluble in an alkaline developer owing to a function of an acid generated from the acid generator while an unexposed portion 2b of the resist film 2 remains insoluble in an alkaline developer because no acid is generated therein.

Subsequently, as shown in FIG. 5D, the resist film 2 is developed with a 2.38 wt % tetramethylammonium hydroxide developer (alkaline developer), so as to form a resist pattern 5 with a line width of 0.07 μm.

As shown in FIG. 5D, however, the resultant resist pattern 5 is degraded in its cross-sectional shape. When the shape of the resist pattern 5 is thus degraded, a failure is caused in a pattern formed by using this resist pattern 5 as a mask, resulting in lowering the yield in the semiconductor process.

SUMMARY OF THE INVENTION

In consideration of the aforementioned conventional problem, an object of the invention is forming a resist pattern in a good cross-sectional shape by selectively irradiating a resist film with extreme UV.

The present inventors have examined the reason why a resist pattern formed by irradiating a resist film with extreme UV has a degraded shape, resulting in finding that this is because the temperature of the resist film is abruptly increased when irradiated with extreme UV. It seems that the temperature is thus increased because the exposure energy and the exposure power of the extreme UV used for irradiating the resist film are too large in the conventional pattern formation method.

Therefore, the present inventors have made experiments for finding abrupt substrate temperature increase that can definitely prevent the degradation in the shape of a resist pattern. As a result, it has been found that when the abrupt substrate temperature increase is suppressed to approximately 1° C., the shape of a resist pattern can be definitely prevented from degrading.

Next, the present inventors have made experiments for the relationship between the exposure energy of extreme UV and the abrupt substrate temperature increase and the relationship between the exposure power of extreme UV and the abrupt substrate temperature increase. As a result, it has been found that when the exposure energy of extreme UV is set to 5 mJ/cm$^2$ or less or the exposure power of extreme UV is set to 5 W or less, the abrupt substrate temperature increase can be suppressed to approximately 1° C.

The present invention was devised on the basis of these findings, and specifically is practiced by the following pattern formation methods:

The first pattern formation method of this invention includes the steps of performing pattern exposure by selectively irradiating a resist film with extreme UV of a wavelength of a 1 nm through 30 nm band at exposure energy of 5 mJ/cm$^2$ or less; and forming a resist pattern by developing the resist film after the pattern exposure.

In the first pattern formation method, the pattern exposure is performed by selectively irradiating the resist film with extreme UV at exposure energy of 5 mJ/cm$^2$ or less, and therefore, the abrupt substrate temperature increase can be suppressed to approximately 1° C. As a result, the resist pattern can be formed in a good cross-sectional shape.

The second pattern formation method of this invention includes the steps of performing pattern exposure by selectively irradiating a resist film with extreme UV of a wavelength of a 1 nm through 30 nm band at exposure power of 5 W or less; and forming a resist pattern by developing the resist film after the pattern exposure.

In the second pattern formation method, the pattern exposure is performed by selectively irradiating the resist film with extreme UV at exposure power of 5 W or less, and therefore, the abrupt substrate temperature increase can be suppressed to approximately 1° C. As a result, the resist pattern can be formed in a good cross-sectional shape.

The third pattern formation method of this invention includes the steps of performing pattern exposure by selectively irradiating a resist film with extreme UV of a wavelength of a 1 nm through 30 nm band at exposure energy of 5 mJ/cm$^2$ or less and exposure power of 5 W or less; and forming a resist pattern by developing the resist film after the pattern exposure.

In the third pattern formation method, the pattern exposure is performed by selectively irradiating the resist film with extreme UV at exposure energy of 5 mJ/cm$^2$ or less and exposure power of 5 W or less, and therefore, the abrupt substrate temperature increase can be suppressed to approximately 1° C. As a result, the resist pattern can be formed in a good cross-sectional shape.

In any of the first through third pattern formation methods, the resist film is preferably made of a chemically amplified resist material.

When a chemically amplified resist material with high resolution and sensitivity is thus used, a good resist pattern can be obtained even when the exposure energy of extreme UV is 5 mJ/cm² or less or the exposure power of extreme UV is 5 W or less.

In any of the first through third pattern formation methods, the extreme UV preferably has a wavelength of a 13.5 nm band.

DETAILED DESCRIPTION OF THE INVENTION

Embodiment 1

A pattern formation method according to Embodiment 1 of the invention will now be described with reference to FIGS. 1A through 1D and 2. As a characteristic of the pattern formation method of Embodiment 1, pattern exposure is performed by selectively irradiating a resist film with extreme UV of a wavelength of a 13.5 nm band at exposure energy of 5 mJ/cm² or less.

First, a chemically amplified resist material having the following composition is prepared. In the chemically amplified resist material used in Embodiment 1, the amount of acid generator is increased by five times as compared with that in a chemically amplified resist material used in a conventional pattern formation method.

| | |
|---|---|
| Base polymer: poly((2-methyl-2-adamantyl acrylate) – (γ-butyrolactone methacrylate)) (wherein 2-methyl-2-adamantyl acrylate:γ-butyrolactone methacrylate = 60 mol %:40 mol %) | 2 g |
| Acid generator: triphenylsulfonium triflate | 0.2 g |
| Solvent: propylene glycol monomethyl ether acetate | 20 g |

Figure 1A:
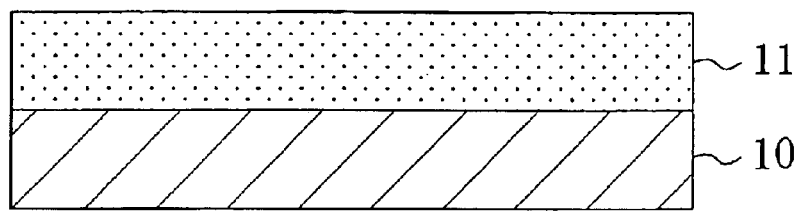
FIGS. 1A, 1B, 1C and 1D are cross-sectional views for showing procedures in a pattern formation method according to Embodiment 1 of the invention.

Next, as shown in FIG. 1A, the chemically amplified resist material is applied on a semiconductor substrate 10, so as to form a resist film 11 with a thickness of 0.2 μm. Thereafter, the resist film 11 is pre-baked.

Figure 1B:
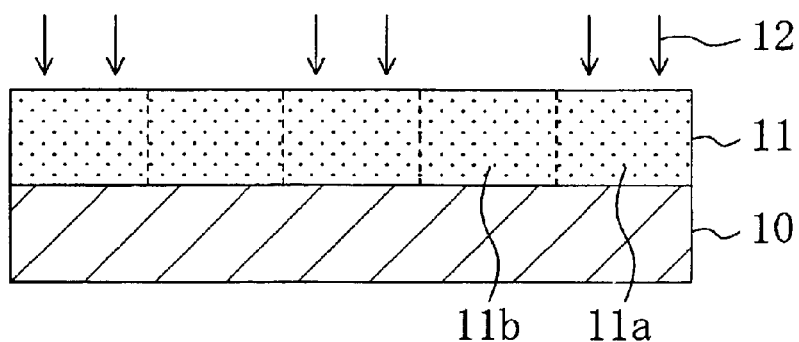

Then, as shown in FIG. 1B, pattern exposure is performed by irradiating the pre-baked resist film 11 with extreme UV 12 (of a wavelength of a 13.5 nm band) output by a laser plasma light source and having exposure power of 10 W and exposure energy of 4 mJ/cm² selectively through a reflection mask not shown.

Figure 1C:
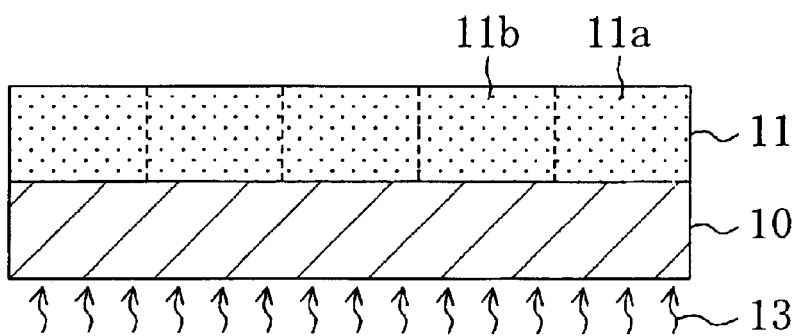

Next, as shown in FIG. 1C, the resist film 11 having been subjected to the pattern exposure is subjected to baking 13 at a temperature of 100° C. for 60 seconds with a hot plate. Thus, an exposed portion 11a of the resist film 11 becomes soluble in an alkaline developer owing to a function of an acid generated from the acid generator while an unexposed portion 11b of the resist film 11 remains insoluble in an alkaline developer because no acid is generated therein.

Figure 1D:
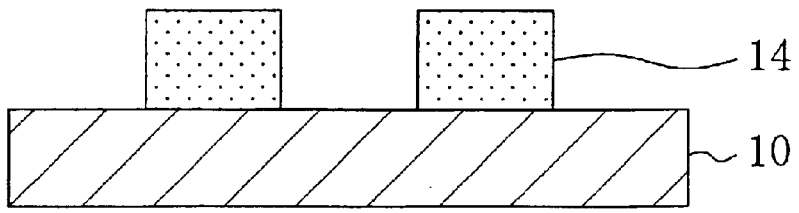

Subsequently, as shown in FIG. 1D, the resist film 11 is developed with a 2.38 wt % tetramethylammonium hydroxide developer (alkaline developer), so as to form a resist pattern 14 with a line width of 0.7 μm.

Figure 2:
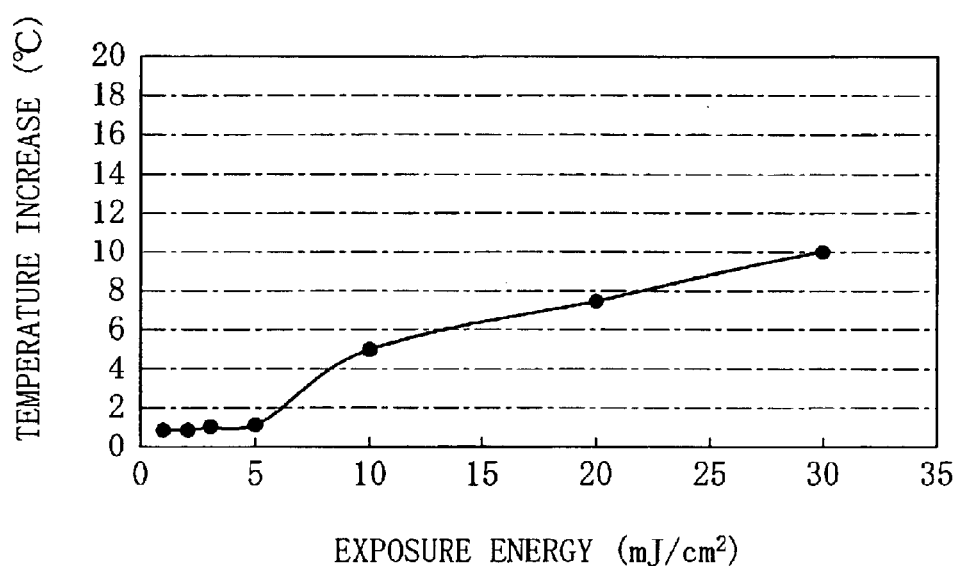
FIG. 2 is a characteristic diagram for showing the relationship between exposure energy of extreme UV and abrupt substrate temperature increase.

FIG. 2 shows the relationship between the exposure energy of the extreme UV 12 and temperature increase (abrupt temperature increase) of the semiconductor substrate 10 for 10 seconds. It is understood from FIG. 2 that when the exposure energy of the extreme UV 12 is set to 5 mJ/m² or less, the abrupt substrate temperature increase can be suppressed to approximately 1° C.

In Embodiment 1, since the pattern exposure is performed by selectively irradiating the resist film 11 with extreme UV at exposure energy of 5 mJ/cm² or less, the abrupt substrate temperature increase can be suppressed to approximately 1° C. Accordingly, shape degradation of the resist pattern 14 can be suppressed so as to form the resist pattern 14 in a good cross-sectional shape.

The exposure energy of the extreme UV 12 can be lowered to an extent that the resist pattern 14 can be formed by developing the resist film 11 with an alkaline developer after the pattern exposure. In other words, the exposure energy of the extreme UV 12 is preferably lower as far as the resist pattern 14 can be formed.

Furthermore, the abrupt substrate temperature increase is also related to the thickness of the resist film 11. In the case where the resist film 11 has a general thickness (of 0.2 μm), the abrupt substrate temperature increase can be suppressed to approximately 1° C. by setting the exposure energy of the extreme UV 12 to 5 mJ/cm² or less.

In the case where the energy of extreme UV (of a wavelength of a 13.5 nm band) is set to 5 mJ/cm² or less, it is necessary to increase the sensitivity of the chemically amplified resist material as compared with that in the conventional method.

The sensitivity of the chemically amplified resist material can be increased by increasing the amount of acid generator included in the chemically amplified resist material by, for example, five times as described above. Alternatively, as described below, a highly sensitive chemically amplified resist material may be used, the acid strength of the acid generator included in the chemically amplified resist material may be increased, or a protecting group that can be more easily released by an acid may be included in the base polymer of the chemically amplified resist material.

(1) Examples of the highly sensitive chemically amplified resist material are as follows:

| (a) Example of chemically amplified resist material including phenol polymer: | |
|---|---|
| Base polymer: poly((1-ethoxyethoxystyrene) – (vinylphenol)) (wherein 1-ethoxyethoxystyrene:vinylphenol = 35 mol %: 65 mol %) | 2 g |
| Acid generator: 1,4-diphenyl diazodisulfone | 0.16 g |
| Solvent: propylene glycol monomethyl ether acetate | 20 g |

| (b) Example of chemically amplified resist material including cycloolefin polymer: | |
|---|---|
| Base polymer: poly((5-t-butylnorbornene carboxylate) – (maleic anhydride)) (wherein 5-t-butylnorbornene carboxylate: maleic anhydride = 50 mol %:50 mol %) | 2 g |
| Acid generator: triphenylsulfonium nonafluorobutanesulfonate | 0.22 g |
| Solvent: propylene glycol monomethyl ether acetate | 20 g |

(2) Examples of the acid generator with high acid strength are as follows:

triphenylsulfonium trifluoromethanesulfonate triphenylsulfonium nonafluorobutanesulfonate benzeneimino trifluoromethanesulfonate naphthaleneimino trifluoromethanesulfonate phthalimino trifluoromethanesulfonate benzeneimino nonafluorobutanesulfonate naphthaleneimino nonafluorobutanesulfonate phthalimino nonafluorobutanesulfonate (3) Examples of the protecting group easily released by an acid are as follows:

1-ethoxyethyl group 1-methoxyethyl group 1-benzyloxyethyl group 1-phenoxyethyl group trimethylsilyl group Embodiment 2

A pattern formation method according to Embodiment 2 of the invention will now be described with reference to FIGS. 3A through 3D and 4. As a characteristic of the pattern formation method of Embodiment 2, pattern exposure is performed by selectively irradiating a resist film with extreme UV of a wavelength of a 13.5 nm band at exposure power of 5 W or less.

First, a chemically amplified resist material having the following composition is prepared. The chemically amplified resist material used in Embodiment 2 is equivalent to a chemically amplified resist material used in a conventional pattern formation method.

| | |
|---|---|
| Base polymer: poly((2-methyl-2-adamantyl acrylate) – (γ-butyrolactone methacrylate)) (wherein 2-methyl-2-adamantyl acrylate:γ-butyrolactone methacrylate = 60 mol %:40 mol %) | 2 g |
| Acid generator: triphenylsulfonium triflate | 0.04 g |
| Solvent: propylene glycol monomethyl ether acetate | 20 g |

Figure 3A:
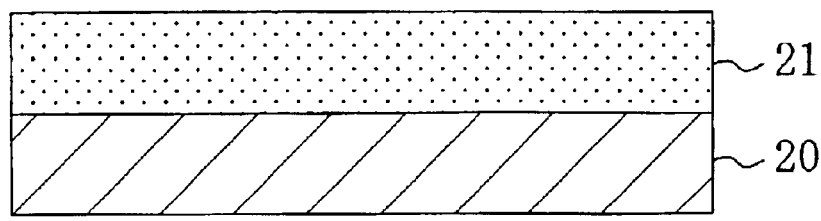
FIGS. 3A, 3B, 3C and 3D are cross-sectional views for showing procedures in a pattern formation method according to Embodiment 2 of the invention.

Next, as shown in FIG. 3A, the chemically amplified resist material is applied on a semiconductor substrate 20, so as to form a resist film 21 with a thickness of 0.2 μm. Thereafter, the resist film 21 is pre-baked.

Figure 3B:
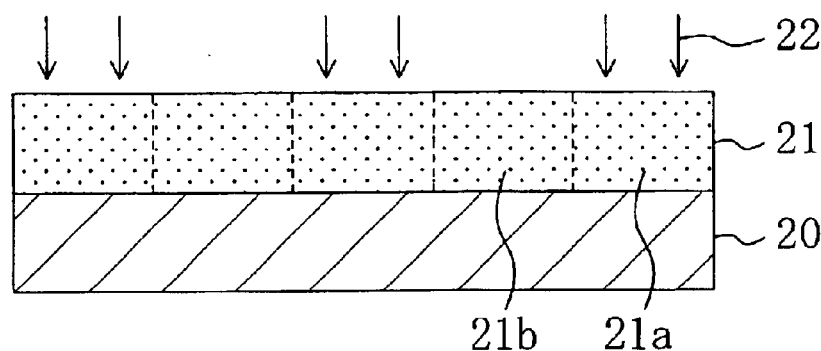

Then, as shown in FIG. 3B, pattern exposure is performed by irradiating the pre-baked resist film 21 with extreme UV 22 (of a wavelength of a 13.5 nm band) output by a laser plasma light source and having exposure power of 4 W selectively through a reflection mask not shown.

Figure 3C:
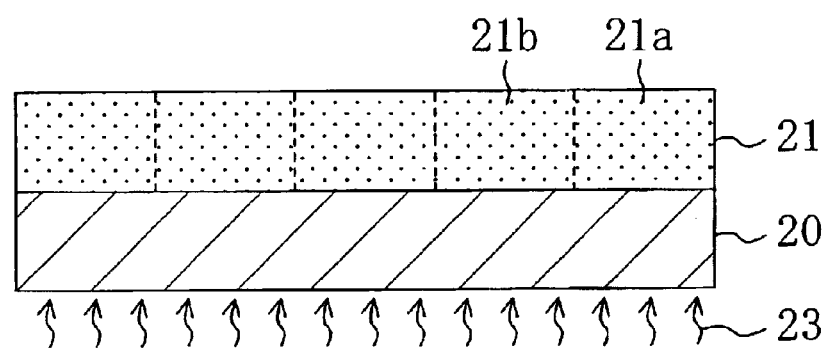

Thereafter, as shown in FIG. 3C, the resist film 21 having been subjected to the pattern exposure is subjected to baking 23 at a temperature of 100° C. for 60 seconds with a hot plate. Thus, an exposed portion 21a of the resist film 21 becomes soluble in an alkaline developer owing to a function of an acid generated from the acid generator while an unexposed portion 21b of the resist film 21 remains insoluble in an alkaline developer because no acid is generated therein.

Figure 3D:
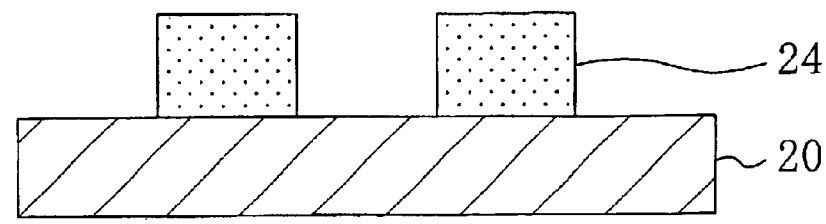

Subsequently, as shown in FIG. 3D, the resist film 21 is developed with a 2.38 wt % tetramethylammonium hydroxide developer (alkaline developer), so as to form a resist pattern 24 with a line width of 0.7 μm.

Figure 4:
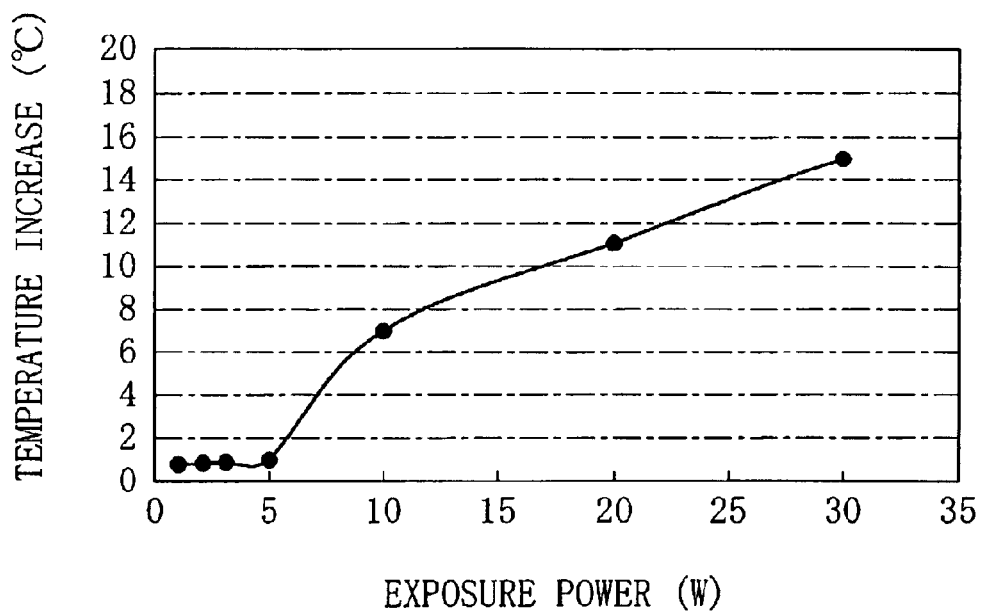
FIG. 4 is a characteristic diagram for showing the relationship between exposure power of extreme UV and abrupt substrate temperature increase.
Figure 5A:
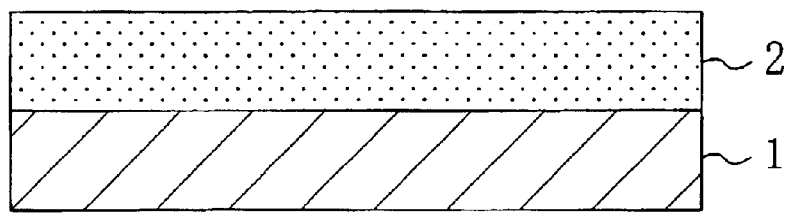
FIGS. 5A, 5B, 5C and 5D are cross-sectional views for showing procedures in a conventional pattern formation method.
Figure 5B:
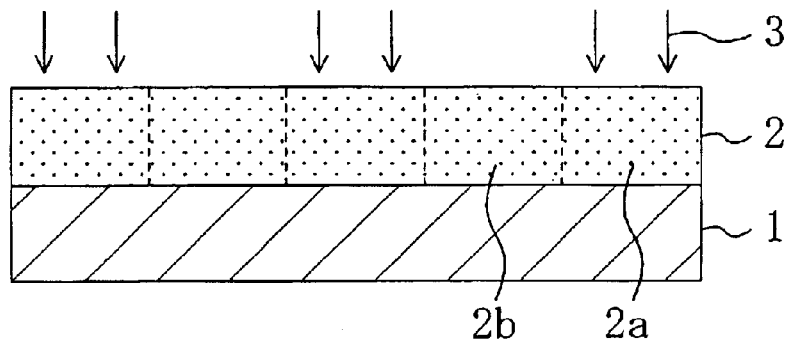
Figure 5C:
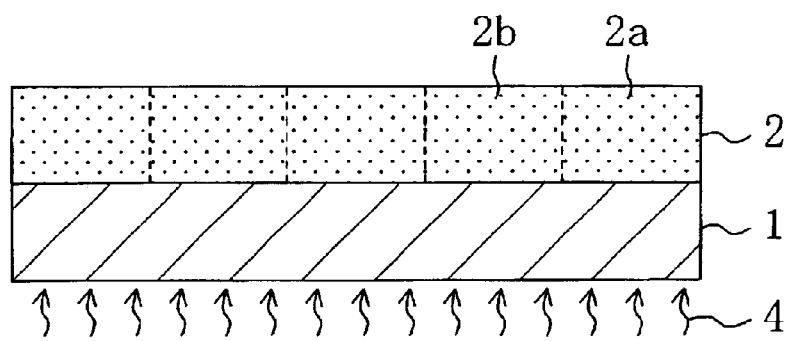
Figure 5D:
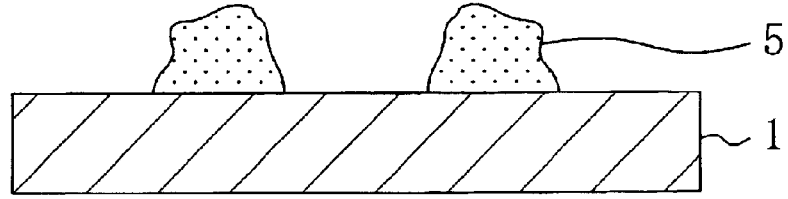

FIG. 4 shows the relationship between the exposure power of the extreme UV 22 and temperature increase (abrupt temperature increase) of the semiconductor substrate 20 for 10 seconds. It is understood from FIG. 4 that when the exposure power of the extreme UV 22 is set to 5 W or less, the abrupt substrate temperature increase can be suppressed to approximately 1° C.

In Embodiment 2, since the pattern exposure is performed by selectively irradiating the resist film 21 with extreme UV at exposure power of 5 W or less, the abrupt substrate temperature increase can be suppressed to approximately 1° C. Accordingly, shape degradation of the resist pattern 24 can be suppressed so as to form the resist pattern 24 in a good cross-sectional shape.

The exposure energy of the extreme UV 22 can be lowered to an extent that the resist pattern 24 can be formed by developing the resist film 21 with an alkaline developer after the pattern exposure. In other words, the exposure energy of the extreme UV 22 is preferably lower as far as the resist pattern 24 can be formed.

Furthermore, the abrupt substrate temperature increase is also related to the thickness of the resist film 21. In the case where the resist film 21 has a general thickness (of 0.2 μm), the abrupt substrate temperature increase can be suppressed to approximately 1° C. by setting the exposure power of the extreme UV 22 to 5 W or less.

Although the chemically amplified resist material equivalent to that used in the conventional method is used in Embodiment 2, any of chemically amplified resist materials exemplified in Embodiment 1 may be used instead.

The resist film is irradiated with extreme UV at exposure energy of 5 mJ/cm$^2$ or less in Embodiment 1 and at exposure power of 5 W or less in Embodiment 2. It goes without saying that a resist film may be irradiated with extreme UV at exposure energy of 5 mJ/cm$^2$ or less and exposure power of 5 W or less.

What is claimed is:

1. A pattern formation method comprising the steps of:

performing pattern exposure by selectively irradiating a resist film with extreme UV of a wavelength of a 1 nm through 30 nm ban at exposure energy of 5 W or less; and forming a resist pattern by developing said resist film after the pattern exposure.

2. The pattern formation method of claim 1, wherein said resist film is made of a chemically amplified resist material.

3. The pattern formation method of claim 1, wherein said extreme UV has a wavelength of a 13.5 nm band.

4. The pattern formation method of claim 1, wherein the resist film includes a photo acid generator comprising triphenylsulfonium trifluoromethanesulfonate, triphenylsulfonium nonafluorobutanesulfonate, benzeneimino trifluoromethanesulfonate, naphthaleneimino trifluoromethanesulfonate, phthalimino trifluoromethanesulfonate, benzeneimnino nonafluorobutanesulfonate, naphthaleneimino nonafluorobutanesulfonate or phthalimino nonafluorobutanesulfonate.

5. The pattern formation method of claim 1, wherein the resist film has a protecting group easily released by an acid.

6. The pattern formation method of claim 5, wherein the protecting group is 1-ethoxyethyl group, 1-methoxyethyl group, 1-benzyloxyethyl group, 1-benzyloxyethyl group, 1-phenoxyethyl group or trimethylsilyl group.

7. A pattern formation method comprising the steps of:

performing pattern exposure by selectively irradiating a resist film with extreme UV of a wavelength of a 1 nm through 30 nm band at exposure power of 5 W or less; and forming a resist pattern by developing said resist film after the pattern exposure.

8. The pattern formation method of claim 7, wherein said resist film is made of a chemically amplified resist material.

9. The pattern formation method of claim 7, wherein said extreme UV has a wavelength of a 13.5 nm band.

10. The pattern formation method of claim 7, wherein the resist film includes a photo acid generator comprising triphenylsulfonium trifluoromethanesulfonate, triphenylsulfonium nonafluorobutanesulfonate, benzeneimino trifluoromethanesulfonate, naphthaleneimino trifluoromethanesulfonate, phthalimino trifluoromethanesulfonate, benzeneimino nonafluorobutanesulfonate, naphthaleneimino nonafluorobutanesulfonate or phthalimino nonafluorobutanesulfonate.

11. The pattern formation method of claim 7, wherein the resist film has a protecting group easily released by an acid.

12. The pattern formation method of claim 11, wherein the protecting group is 1-ethoxyethyl group, 1-methoxyethyl group, 1-benzyloxyethyl group, 1-benzyloxyethyl group, 1-phenoxyethyl group or trimethylsilyl group.

* * * * *